United States Patent
Liu et al.

(10) Patent No.: US 10,520,821 B2
(45) Date of Patent: Dec. 31, 2019

(54) LITHOGRAPHY PROCESS WITH ENHANCED ETCH SELECTIVITY

(71) Applicant: Taiwan Semiconductor Manufacturing Co., Ltd., Hsinchu (TW)

(72) Inventors: Chen-Yu Liu, Kaohsiung (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 135 days.

(21) Appl. No.: 15/697,226

(22) Filed: Sep. 6, 2017

(65) Prior Publication Data

US 2018/0149976 A1 May 31, 2018

Related U.S. Application Data

(60) Provisional application No. 62/427,656, filed on Nov. 29, 2016.

(51) Int. Cl.

| | | |
|---|---|---|
| *G03F 7/38* | (2006.01) | |
| *G03F 7/09* | (2006.01) | |
| *G03F 7/16* | (2006.01) | |
| *G03F 7/20* | (2006.01) | |
| *H01L 21/02* | (2006.01) | |
| *H01L 21/027* | (2006.01) | |
| *H01L 21/67* | (2006.01) | |

(52) U.S. Cl.
CPC ............. *G03F 7/38* (2013.01); *G03F 7/091* (2013.01); *G03F 7/16* (2013.01); *G03F 7/20* (2013.01); *H01L 21/0276* (2013.01); *H01L 21/02282* (2013.01); *H01L 21/6715* (2013.01)

(58) Field of Classification Search
CPC ..................................................... G03F 7/0752
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2016/0284557 A1* | 9/2016 | Chen .................. H01L 21/0276 |
| 2017/0018436 A1* | 1/2017 | Hatakeyama ............ G03F 7/11 |

* cited by examiner

*Primary Examiner* — Kathleen Duda
(74) *Attorney, Agent, or Firm* — Haynes and Boone, LLP

(57) ABSTRACT

The present disclosure provides a method for lithography patterning. The method includes coating a bottom layer on a substrate, wherein the bottom layer includes a carbon-rich material; forming a middle layer on the bottom layer, wherein the middle layer has a composition such that its silicon concentration is enhanced to be greater than 42% in weight; coating a photosensitive layer on the middle layer; performing an exposing process to the photosensitive layer; and developing the photosensitive layer to form a patterned photosensitive layer.

20 Claims, 9 Drawing Sheets

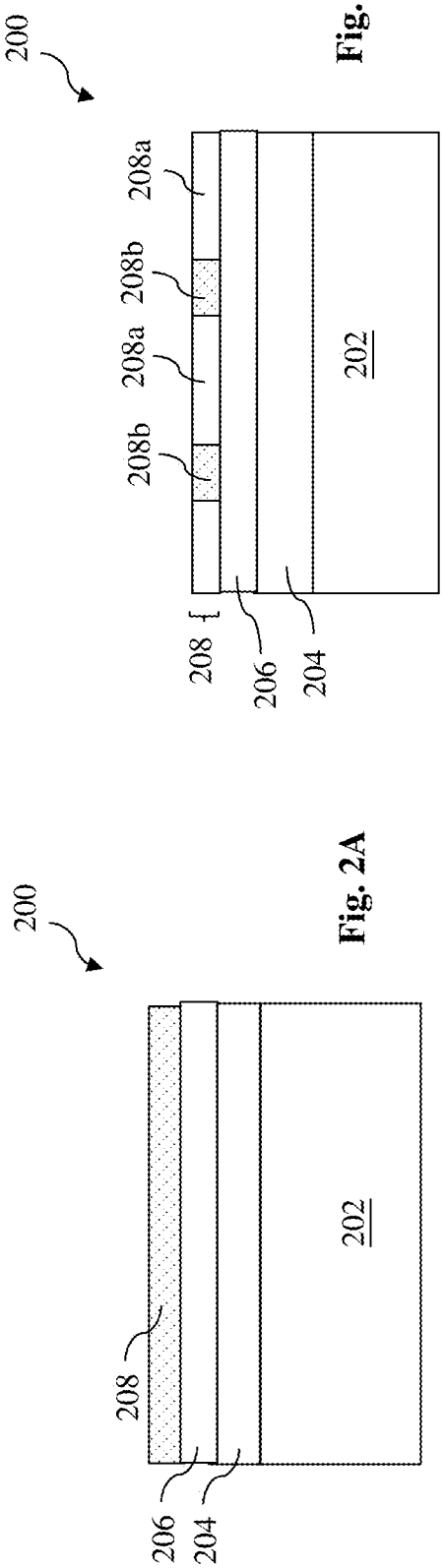
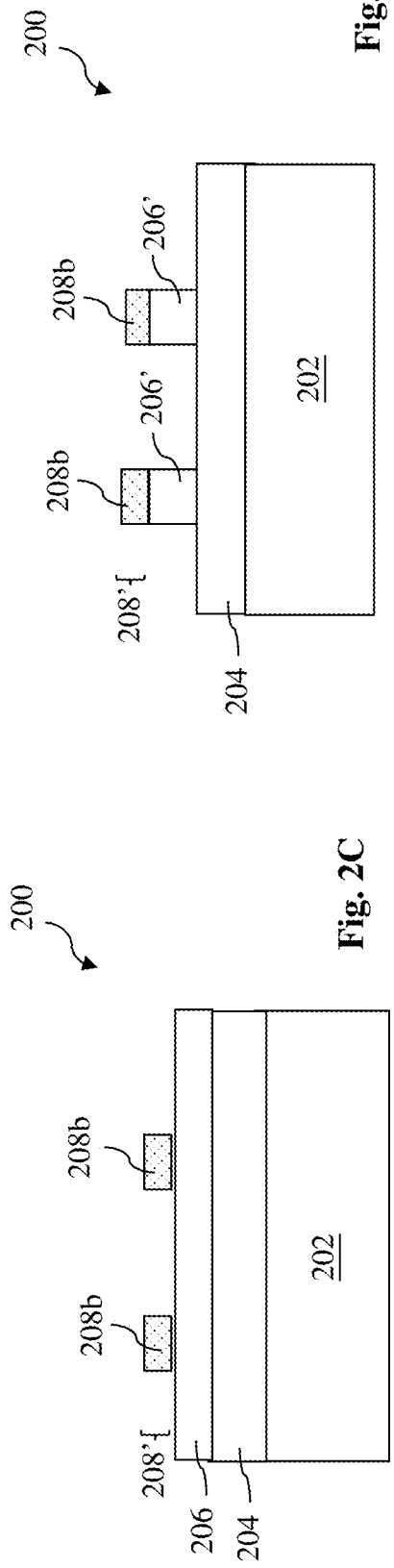

LITHOGRAPHY PROCESS WITH ENHANCED ETCH SELECTIVITY

PRIORITY DATA

This application claims the benefit of U.S. Provisional Application 62/427,656 filed Nov. 29, 2016, entitled "LITHOGRAPHY PROCESS WITH SILICON MASK LAYER HAVING HIGH ETCH SELECTIVITY," herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, a tri-layer photoresist material is used for lithography patterning. However, due to various requirements, such as optical refractivity index and absorption, the tri-layer photoresist may be tuned to meet those requirements but does not have enough etch selectivity for patterning. What are needed are a photoresist and a method using the photoresist to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E and 2F illustrate cross sectional views of a semiconductor structure at various fabrication stages, in accordance with some embodiments.

DETAILED DESCRIPTION

Figure 1:
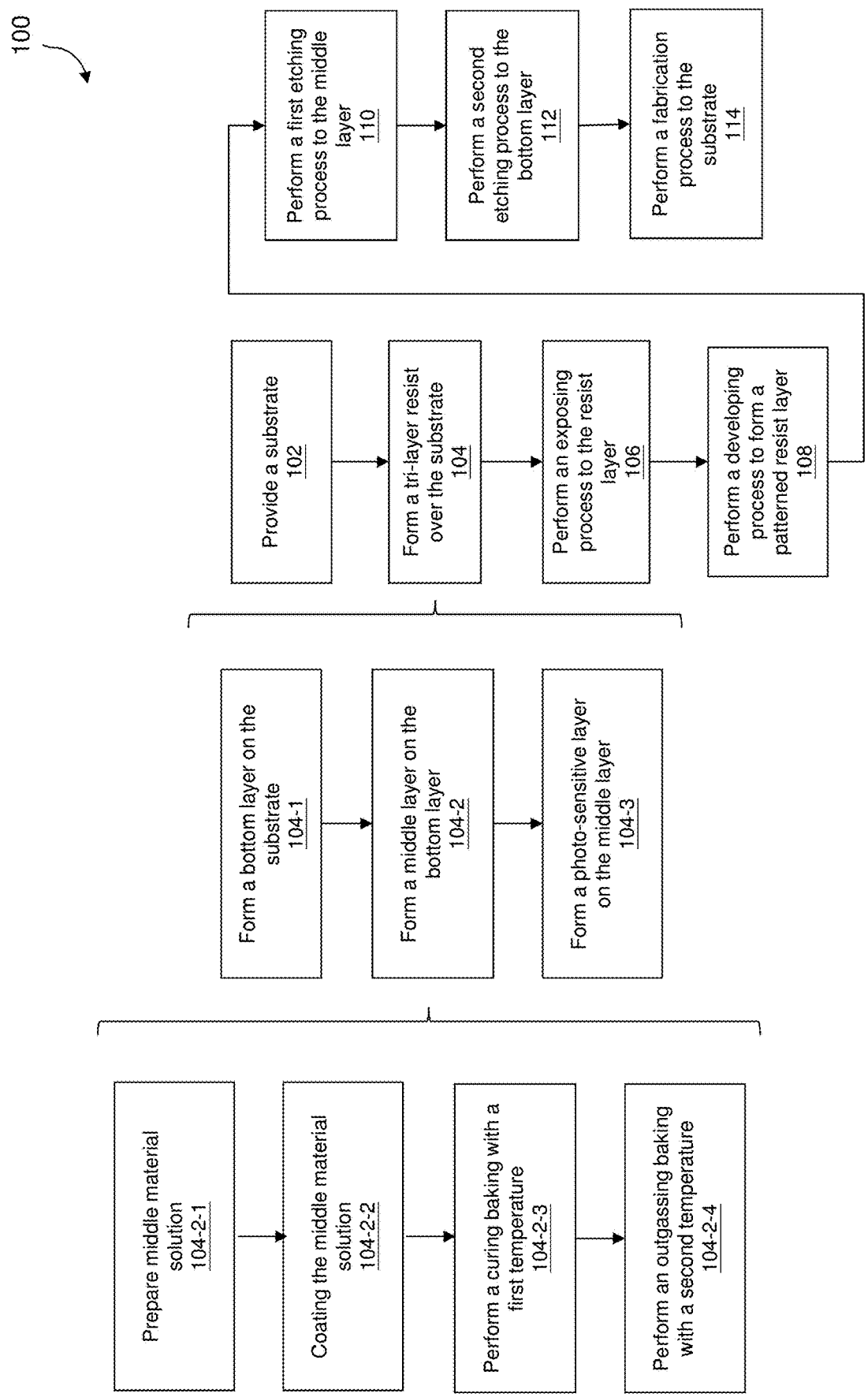
FIG. 1 illustrates a flow chart of a lithography patterning method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of tri-layer photoresist films in lithography and methods of using the same. In lithography patterning, after a resist film is exposed to a radiation, such as a UV, DUV or EUV radiation (or alternatively other radiation, such as an electron beam), it is developed in a developer (a chemical solution). The developer removes portions (such as exposed portions as in a positive-tone photoresist or unexposed portions as in a negative-tone photoresist) of the resist film, thereby forming a resist pattern which may include line patterns and/or trench patterns. The resist pattern is then used as an etch mask in subsequent etching processes, transferring the pattern to an underlying material layer. Alternatively, the resist pattern is implemented in a tri-layer scheme to improve exposure resolution and etch selectivity.

A photoresist that employs the chemical amplification is generally referred to as a "chemically amplified resist (CAR)". The photoresist includes a polymer that resists to etching or ion implantation during semiconductor fabrication; an acid generating compound (e.g., photo acid generator (PAG)); and a solvent. The resist may include other components, such as quencher. In some examples, the polymer also includes at least one acid labile group (ALG) that responds to acid. PAG absorbs radiation energy and generates acid. The polymer and the PAG are mixed in the solvent before the photoresist is applied to a workpiece, such as a semiconductor wafer, during a lithography process.

FIG. 1 is a flow chart of a method 100 of patterning a substrate (e.g., a semiconductor wafer) according to various aspects of the present disclosure in some embodiments. The method 100 may be implemented, in whole or in part, by a system employing advanced lithography processes such as deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 100, and some operations described can be replaced, eliminated, or moved around for additional embodiments of the method.

FIGS. 2A through 2E are sectional views of a semiconductor structure 200 at various fabrication stages, constructed in accordance with some embodiments. The method 100 is described below in conjunction with FIG. 1 and FIGS. 2A through 2E wherein the semiconductor structure 200 is fabricated by using embodiments of the method 100. The semiconductor structure 200 may be an intermediate workpiece fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring now to FIG. 1 in conjunction with FIG. 2A, the method 100 begins at block 102 with a semiconductor structure 200. Referring to FIG. 2A, the semiconductor structure 200 includes a substrate 202. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 includes one or more layers of material or composition. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In some embodiments, the structure 200 may be alternatively a photomask used to pattern a semiconductor wafer. In furtherance of the embodiments, the substrate 202 is a photomask substrate that may include a transparent material (such as quartz), or a low thermal expansion material such as silicon oxide-titanium oxide compound. The photomask substrate 202 may further include a material layer to be patterned. To further this example, the substrate 202 may be a photomask substrate for making a deep ultraviolet (DUV) mask, an extreme ultraviolet (EUV) mask, or other types of masks. Accordingly, the underlayer 204 is material layer to be patterned to define a circuit pattern. For example, the underlayer 204 is an absorber layer, such as chromium layer.

The method 100 proceeds to operation 104 to form a photoresist layer (or simply resist layer) over the substrate 202 (FIG. 2A). In the present embodiment, a tri-layer resist scheme is implemented. Particularly, three material layers are respectively formed on the substrate 102, which are described below.

In some embodiments, the operation 104 includes a first step 104-1 to form a bottom layer (or bottom material layer or BL) 204; a second step 104-2 to form a middle layer (or middle material layer or ML) 206 on the BL; and a third step 104-3 to form a radiation-sensitive layer 208 on the ML.

In the present example, the bottom layer 204 is a carbon-rich layer while the middle layer 206 is a silicon-rich layer designed to provide an etch selectivity between those two layers. The radiation-sensitive layer 208 includes a chemical sensitive to the radiation applied by the corresponding lithography exposing process such that the radiation-sensitive layer is chemically or physically changed in response to the lithography exposing process such that portions (exposed or alternatively unexposed portions) of the resist layer are removed in a developer, thereby forming a patterned resist layer. In the tri-layer resist scheme, the photo-sensitive and etch-resistance functions of the photoresist are spread to those three layers, thus the radiation-sensitive layer can be designed differently (such as thinner) to enhance imaging resolution and lithography patterning quality.

Figure 3:
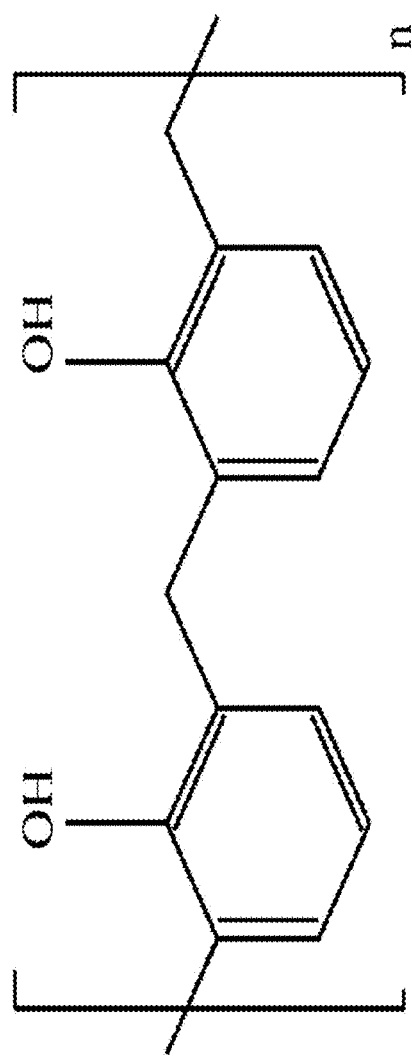
FIG. 3 illustrates a schematic view of a chemical structure in a bottom layer in accordance with some embodiments.

In some embodiments, the bottom layer 204 is carbon-containing polymeric material formed on the substrate 202 by a proper technique, such as spin-on coating. Thus coated bottom layer may be further cured, such as by baking. In various examples, the bottom layer 204 includes novolac resin, such as a chemical structure as illustrated in FIG. 3. In FIG. 3, the polymer includes multiple phenol units bonded together. The parameter "n" in the formula is an integer and is related to the polymerization degree and molecular weight of the corresponding polymer. In other examples, the bottom layer 204 may alternatively include other material(s), such as silicon oxide, silicon nitride (SiN), silicon oxynitride, other suitable material, or a composition thereof.

The middle layer 206 is a silicon-rich material layer deposited on the bottom layer 204 by a proper technique, such as spin-on coating. The middle layer 206 is designed to have a composition different from the bottom layer 204 in order to have enough etch selectivity between those two layers.

When the middle layer 206 is formed on the workpiece by a proper technique, such as spin-on coating, it is in a liquid state, referred to as a middle material solution. The middle material solution includes various chemical components mixed in a solvent. The solvent includes propylene glycol monomethyl ether (PGME), Propylene glycol monomethyl ether acetate (PGMEA), Propylene Glycol Methyl Ether Propionate (PGMEP), N-Methylpyrrolidone or N-methyl-2-pyrrolidine (NMP), acetone, propylene glycol ethyl ether (PGEE), gamma-Butyrolactone (GBL), Dimethyl sulfoxide (DMSO), 2-heptanone, cyclohexanone, Isopropyl alcohol (IPA), methanol, ethanol, n-Butyl acetate (NBAC), and water, in various examples. The chemical components in the middle material solution are described below in accordance with some embodiments.

Figure 4:
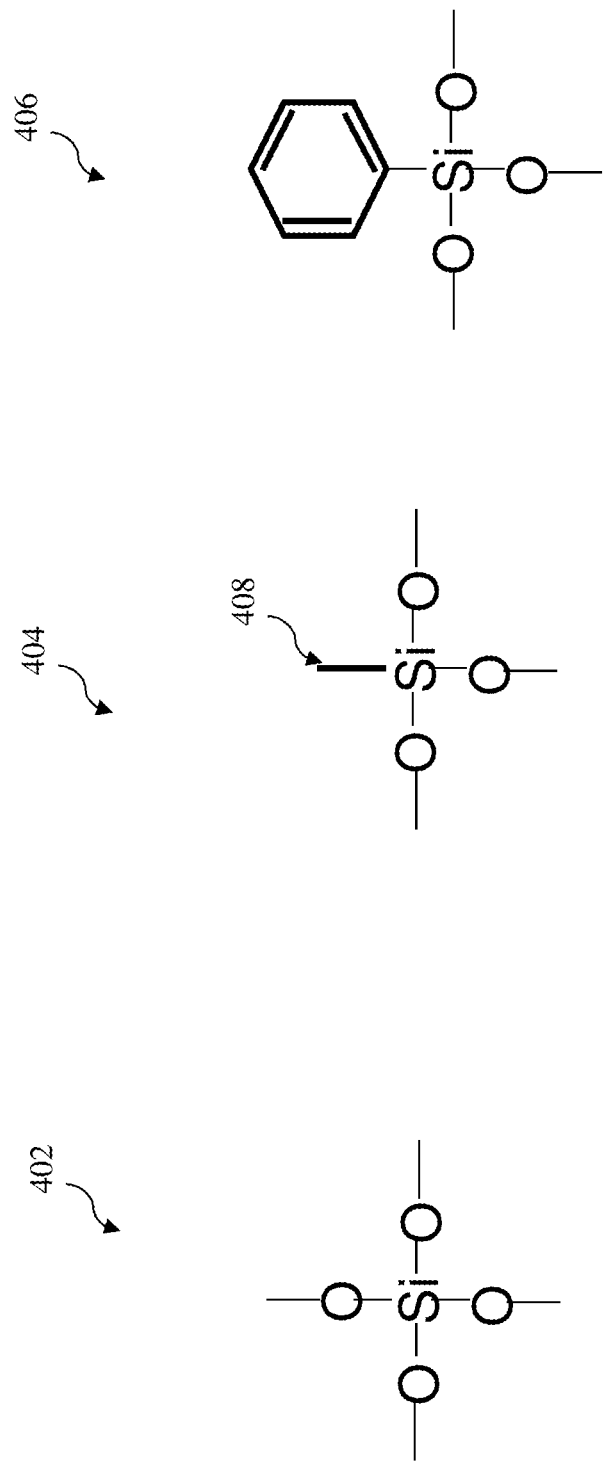
FIG. 4 illustrates s various chemical structures according to some examples.

Usually, the middle material solution includes various chemical components for respectively tuning several lithography parameters or conditions. For example, the middle material solution includes a cross-linker (such as cross-linker having a chemical structure 402 illustrate in FIG. 4) that provides linking function so that the chemicals in the middle layer are cross-linked to form polymer networks. The middle material solution further includes another chemical composition (such as chemical composition having a chemical structure 404 illustrate in FIG. 4) that provides function for tuning contact angle of the radiation-sensitive layer coated on the ML. The middle material solution also includes another chemical composition (such as chemical composition having a chemical structure 406 illustrate in FIG. 4) that provides function to tune refractivity index ("n") and absorption (extinction coefficient or "k") to the radiation. However, all those chemical compositions collectively contribute to higher level of carbon concentration in the final formed middle layer, leading to poor etch selectivity between the middle layer and the bottom layer.

According to the present disclosure, the middle layer 206 is designed to reduce the carbon concentration such that the silicon concentration of the middle layer is relatively increased.

Specifically, some chemical compositions are excluded from the middle material solution according to various experimental data and resist characteristic analysis. For example, the chemical structure 406, with a phenyl group, has a higher carbon concentration, or higher carbon/silicon ratio (6:1). In the present embodiment, the chemical structure 406 is excluded from the middle material solution since the reflectivity control is unnecessary for the present lithography process, such as extreme ultraviolet (EUV) lithography process. In furtherance of the embodiment, the chemical structure 404 is additionally excluded from the middle layer 206 to reduce carbon-containing functional groups bonded thereto, such as bonded to the fourth bond 408 of the chemical structure 404, for the reason that the immersion mode is not used in the EUV lithography and the contact angle tuning can be eliminated. Thus, the carbon concentration in the middle layer is further reduced.

Figure 5B:
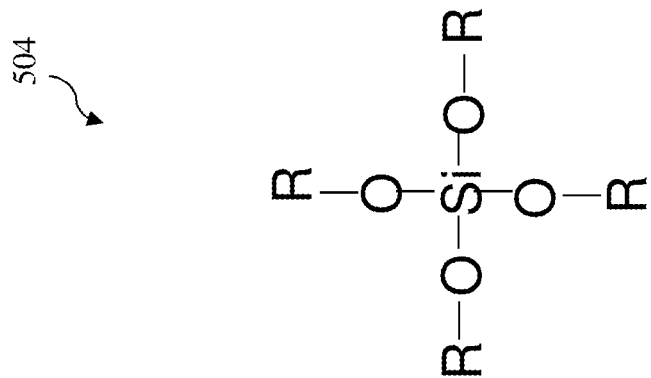
FIGS. 5A and 5B illustrate a chemical structure of a cross-linker in a middle material solution in accordance with some embodiments.
Figure 5A:
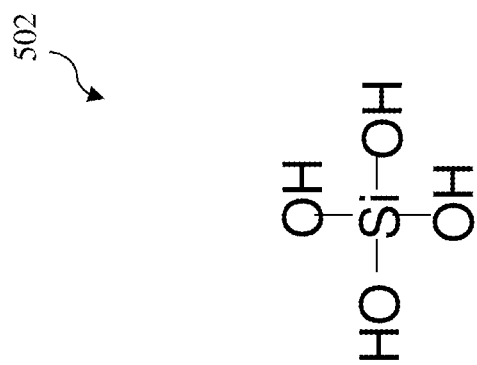

The middle material solution includes cross-linker. The cross-linker includes a silicon hydroxide $Si(OH)_4$, such as a chemical structure 502 illustrated in FIG. 5A. Alternatively, the cross-linker has a chemical structure 504 illustrated in FIG. 5B, wherein the chemical group R is hydrogen (H), hydroxy group (OH), methyl group ($CH_3$), ethyl group ($C_2H_5$) or an alkyl with the number of carbon greater than 4 in some examples. The experimental data show that, by excluding above carbon-containing chemicals from the middle material solution, the etch selectivity between ML and BL is improved from 1 to greater than 1.6. Further, the line critical dimension uniformity (LCDU) is improved from greater than 4.6 to less than 4.2. The LCDU is defined as the standard variation of the line width distribution.

The middle material solution further includes a chemical additive to control pH value of the middle material solution and enhance the cross-linking reaction. The chemical additive in the middle material solution contains carbon. For examples, carbon-containing chemical such as p-Toluenesulfonic acid, Camphor-10-sulfonic acid, Phthalic acid, Pyridinium p-toluenesulfonate, or Sulfanilic acid is used for the purpose. However, those carbon-containing chemicals contribute to the carbon concentration in the middle layer and reduce the etch selectivity. Through experiments, it is found that if the molecular weight (MW) of the chemical additive is chosen or designed to be below a certain level, the chemical additive can be evaporated by outgassing baking, therefore eliminating the carbon contribution from the chemical additive. In the present embodiment, the chemical additive in the middle material solution is designed to have a molecular weight (MW) less than 130 Dalton and an acid dissociation constant pKa less than 7 to enable the evaporation of the chemical additive.

Particularly, it is desired to have the chemical additive to be evaporated only after the cross-linking reaction. If the MW of the chemical additive is controlled to a range such that the outgassing baking temperature of the chemical additive is not too high but just higher than the curing temperature of a curing baking for the cross-linking reaction, then the chemical additive can be controlled to be evaporated only after the cross-linking reaction. For example, the MW of the chemical additive is controlled to a range between 80 and 130. The MW of the chemical additive is controlled by carefully choosing proper chemical with the desired function and proper molecular weight. In some embodiments, the chemical additive includes Oxalic acid, Formic acid, Acetic acid, Propionic acid, Butyric acid, Valeric acid, Caproic acid, or Succinic acid. Accordingly, carbon concentration is reduced and silicon concentration is increased in the middle layer, thus the etch selectivity is enhanced.

Figure 5C:
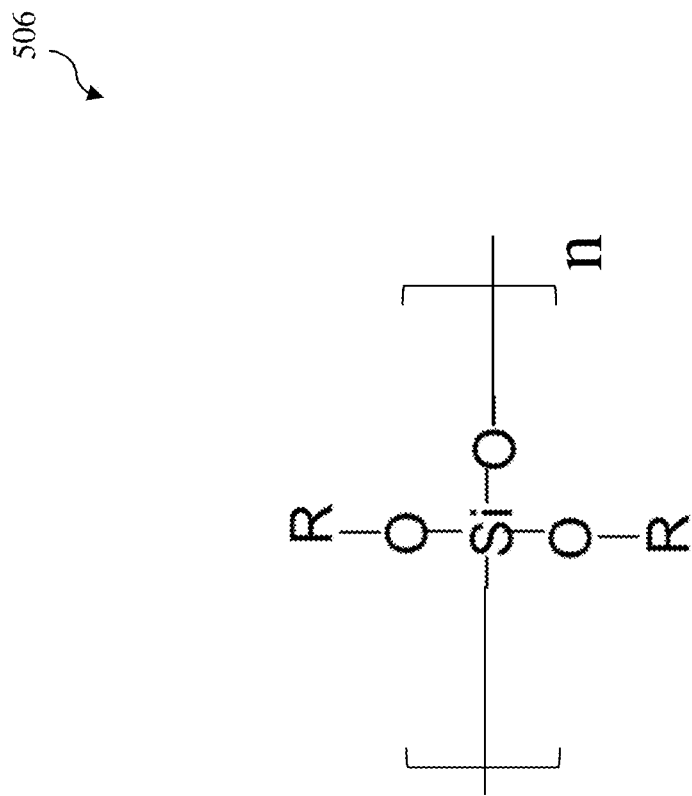
FIG. 5C illustrates a chemical structure of a linear polymer in a middle material solution in accordance with some embodiments.

In the middle material solution, the cross-linkers are linked to form linear polymer chains. In the present embodiment, the linear polymer chains have a chemical structure 506 illustrated in FIG. 5C. The parameter "n" is an integer associated with the polymer chain length and the molecular weight of the linear polymer 506. The chemical group R is hydrogen, hydroxy group (OH), methyl group ($CH_3$), ethyl group ($C_2H_5$) or an alkyl with the number of carbon greater than 4, according to some examples.

The linear polymer chains are designed to have a proper chain length or molecular weight. The chain length of the linear polymer chains is controlled to a certain range for optimized cross-linking, material density of the middle layer, etch selectivity and etch resistance. Therefore the linear polymer chains in the middle material solution are controlled to have a polymer chain length (average length) or molecular weight (average molecular weight) in a range, such as greater than 800 Dalton. In one example, the molecular weight of the linear polymer chains ranges between 800 Dalton and 10,000 Dalton. In one example, the molecular weight of the linear polymer chains ranges between 2,000 Dalton and 3,000 Dalton. In some embodiments, the polymer chain length of the linear polymer chains is controlled by a preheating process including the heating duration and the heating temperature before the middle material solution being coated on the workpiece. For example, the preheating process may has a heating duration ranging from 30 minutes to 720 minutes and a heating temperature ranging from 40° C. to 120° C.

Figure 6:
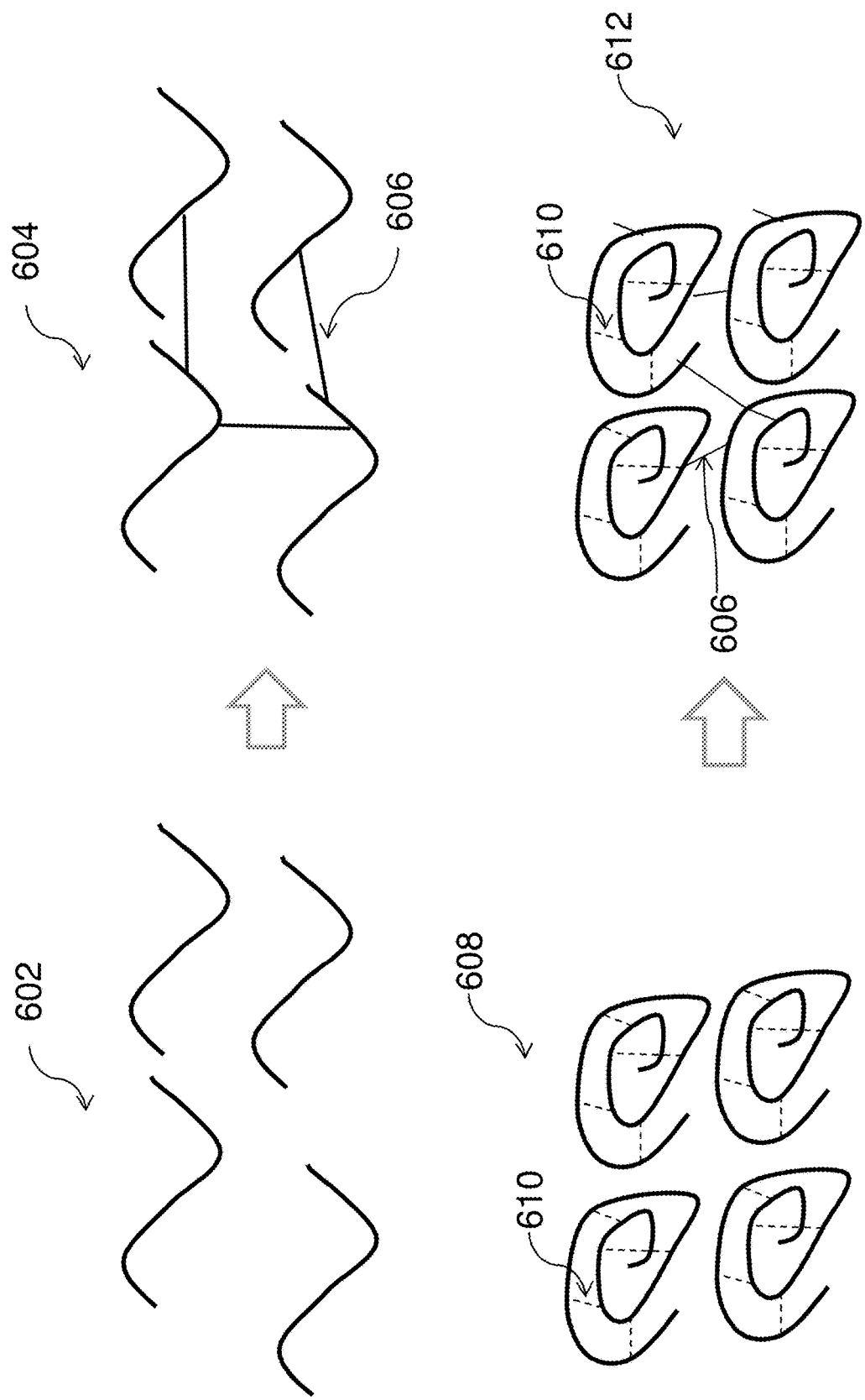
FIG. 6 illustrates intra-molecular reactions and inter-molecular reactions of the polymer in accordance with some embodiments.

Furthermore, the middle material solution is designed to be a diluted solution to enhance cross-linking reaction. The experimental data show that when the middle material solution is diluted to a certain level, the intra-molecular reaction is substantially increased since the mobility of the molecules is increased in the diluted solution. This is further explained below with reference to FIG. 6. FIG. 6 illustrates schematic views of exemplary linear polymer chains before and after cross-linking reactions. When the middle material solution is dense, the linear polymer chains, such as polymer 602, are not mobile enough to reach a configuration of the lowest free energy. Instead, the linear polymer chains may be trapped in a state of a higher free energy, in which the radius of the curly linear polymer chains is greater than the radius of the linear polymer chains in the lowest free energy. Here the radius is defined as the radius of gyration of the polymer (linear polymer chain in the present case) and is referred to as radius of gyration or gyration radius. The gyration radius is statistically defined. Accordingly, the relative distance among various segments of a linear polymer chain is relative large, therefore less possibility of intra-molecular reaction. The corresponding linear polymer chains are cross-linked to form polymer, such as polymer 604, after the cross-linking baking process. Cross-linking bonds 606 are among different molecules (different linear polymer chains). There is no or much less possibility of intra-molecular reaction (reaction among different segments of a same linear polymer chain).

In contrary, when the middle material solution is diluted enough, the linear polymer chains, such as polymer 608, are mobile enough to reach a configuration of the lowest free energy. The linear polymer chains in the lowest free energy have a gyration radius is minimized and is less than the gyration radius of the linear polymer chains that is not in the lowest free energy. Accordingly, the relative distance among various segments of a linear polymer chain is relative small, therefore more possibility of intra-molecular reaction, such hydrogen bonding 610. After the cross-linking baking process, the linear polymer chains are further cross-linked among different linear polymer chains or inter-molecular reaction, such as polymer 612. In polymer 612, both intra-molecular bonding 610 and inter-molecular bonding 606 are formed, rendering the polymer 612 more strong mechanical strength and high density with high etch resistance and etch selectivity.

In the present embodiment, the middle material solution is tuned to have a polymer concentration less than 20% compared with existing synthesis methods. In the above, the value 20% is a weight percentage to the solvent.

When the middle material solution is thus prepared, it is applied to the workpiece, such as the bottom layer 204 in FIG. 2A, such as by spin-on coating. Afterward, the coated middle material solution is further thermally processed for cross-linking reaction and outgassing. In the present embodiment, the thermal process includes two step baking process. The first baking process is designed with a first baking temperature to initiate the cross-linking reaction, so being referred to as cross-linking baking process or a curing baking process. The second baking process is designed with a second baking temperature to initiate the outgassing of the chemical additive, so being referred to as outgassing baking process. The second baking temperature is greater than the first baking temperature and the cross-linking baking process is implemented before the outgassing baking process. Thus, the outgassing is not initiated during the cross-linking baking process. Otherwise, the chemical additive is reduced and the cross-linking efficiency is decreased during the cross-linking baking process. The outgassing baking process is started only after the completion of the cross-linking baking process due to the baking temperature difference and baking sequence, thus maintaining the cross-linking efficiency.

In the present embodiment, the first baking temperature is less than 200° C. and the second baking temperature is greater than 200° C. In some examples, the first baking temperature ranges between 150° C. and 200° C. The first baking duration may range between 30 second and 80 seconds. In some examples, the second baking temperature ranges between 200° C. and 300° C. The second baking duration may range between 80 second and 150 seconds.

Figure 7:
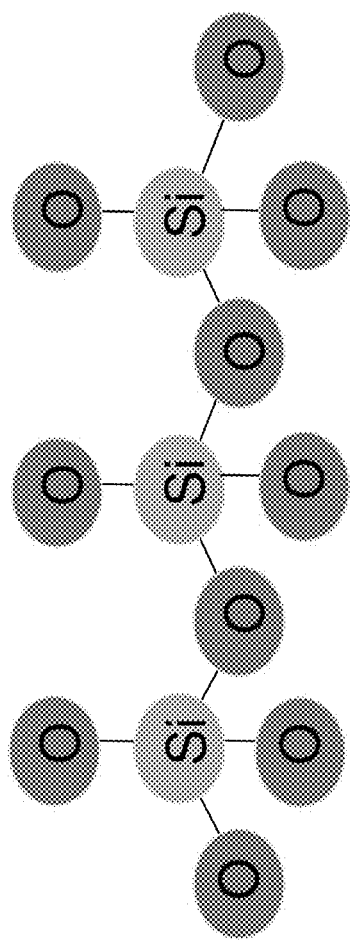
FIG. 7 illustrates a chemical structure of a middle layer in accordance with some embodiments.

Accordingly, the operation 104-2 to form the middle layer 206 includes a series of steps: a first sub-step 104-2-1 to prepare the middle material solution; a second sub-step 104-2-2 to coat the middle material solution to the workpiece; a third sub-step 104-2-3 to perform a curing baking process with a first baking temperature; and a fourth sub-step 104-2-4 to perform an outgassing baking process with a second baking temperature greater than the first baking temperature, as illustrated in FIG. 1, according to the present embodiment. In furtherance of the embodiment, the first sub-step 104-2-1 includes preparing the middle material solution with the polymer concentration less than 20% (polymer weight percentage) and pre-heating the polymer to form linear-polymer chains with desired polymer chain length. The outgassing baking process is implemented after the curing baking process. Thus formed middle layer 206 is substantially rich in silicon. In present embodiment, the silicon concentration of the middle layer 206 is increased to 42% or greater based on the total weight of the middle layer 206. Specifically, the silicon concentration is defined as a ratio of the silicon weight in the middle layer over the total weight of the middle layer. In furtherance of the embodiment, the silicon concentration of the middle layer 206 ranges from 42% to 46%. In contrary, the existing middle layer has silicon concentration less than 42%, such as 20%~35%. In one example, thus formed middle layer 206 includes a chemical structure, such as orthosilicate 700 illustrated in FIG. 7.

Referring back to FIG. 1, the operation 104 to form the resist layer includes the third step 104-3 to form the radiation-sensitive layer (or photo-sensitive layer or simply resist layer) 208 on the middle layer 206 (FIG. 2A). The photo-sensitive resist layer 208 is sensitive to radiation used in a lithography exposure process and also has a resistance to etch. Referring to FIG. 2A, in an embodiment, the resist layer 208 is formed by spin-on coating process. In some embodiments, the resist layer 208 is further treated with a soft baking process. In some embodiments, the resist layer 208 is sensitive to a radiation, such as I-line light, a DUV light (e.g., 248 nm radiation by krypton fluoride (KrF) excimer laser or 193 nm radiation by argon fluoride (ArF) excimer laser), a EUV light (e.g., 135 nm light), an electron beam (e-beam), and an ion beam.

In the present example, the photoresist utilizes a chemical amplification (CA) photoresist material. For example, the CA resist material is positive tone and includes a polymer material that turns soluble to a developer after the polymeric material is reacted with acid. In another example, the CA resist material is negative tone and includes a polymer material that turns insoluble to a developer such as a base solution after the polymer is reacted with acid. In yet another example, the CA resist material includes a polymer material that changes its polarity after the polymer is reacted with acid.

The resist material includes a polymeric material (simply polymer) that resists to etching during semiconductor fabrication. In various embodiments, the polymer includes a poly(norbornene)-co-malaic anhydride (COMA) polymer, a polyhydroxystyrene (PHS) polymer, or an acrylate-based polymer. For example, the acrylate-based polymer includes a poly (methyl methacrylate) (PMMA) polymer. Furthermore, PHS is also sensitive to EUV and is able to function as sensitizer for EUV resist.

The resist material includes an acid generating compound, such as photoacid generator (PAG). The PAG absorbs radiation energy and generates acid. In some embodiments, the PAG includes a phenyl ring. In a particular example, the PAG includes a sulfonium cation, such as a triphenylsulfonium (TPS) group; and an anion, such as a triflate anion. In some examples, the anion includes a sulfonyl hydroxide or fluoroalky sulfonyl hydroxide.

In some examples, the resist material further includes acid-labile group (ALG) or dissolution inhibitor bonded to the backbone of the polymer. The ALG chemically changes in response to acid. For example, the ALG is cleaved in the presence of acid so that the polarity of the resist is increased or alternatively decreased. Thus, the ALG is deprotected by PAG in exposed areas of the resist layer. The exposed resist changes the polarity and dissolubility. For example, the exposed resist material has an increased dissolubility in a developer (for a positive-tone resist) or decreased dissolubility in a developer (for a negative-tone resist). When the exposing dose of the lithography exposing process reaches a dose threshold, the exposed resist material will be dissoluble in the developer or alternatively the exposed resist material will be soluble in the developer. In one example, the ALG includes t-butoxycardbonyl (tBOC).

The resist material may further include a sensitizer to increase the sensitivity and efficiency of the resist material when the radiation is extreme ultraviolet (EUV). The PAG in the resist material may not be sensitive to EUV but is more sensitive to electrons or other radiation, such DUV. Thus, by incorporating the sensitizer, the resist material has an enhanced sensitivity to the first radiation. Particularly, the sensitizer is sensitive to the first radiation and be able to generate a second radiation in response to the first radiation. In the present embodiment, the first radiation is EUV radiation and the second radiation is electron(s). The sensitizer absorbs EUV radiation and generates secondary electron. Furthermore, the PAG is sensitive to the secondary electron, absorbs the secondary electron and generates acid. In various examples, the sensitizer includes a fluorine-containing chemical, a metal-containing chemical, a phenol-containing chemical or a combination thereof. In some examples, the sensitizer includes polyhydroxystyrene, poly-fluorostyrene, or poly-chlorostyrene. The sensitizer may be bonded to the polymer.

In some embodiments, the resist material may include other components, such as quencher that is a base type and is capable of neutralizing acid. Collectively or alternatively, the quencher may inhibit other active component of the resist, such as inhibiting PAG and photo acid from reaction. In one example, the quencher includes a nitrogen atom having an unpaired electron capable of neutralizing an acid. Various chemical components are mixed in a solvent to form a resist solution when it is coated on a workpiece. The solvent may be aqueous solvent or organic solvent.

Referring to FIGS. 1 and 2B, the method 100 proceeds to operation 106 by performing an exposing process to the resist layer 208 to the radiation beam in a lithography system. In some embodiments, the radiation is a EUV radiation (e.g., 13.5 nm). In some embodiments, the radiation may be an I-line (365 nm), a DUV radiation such as KrF excimer laser (248 nm), ArF excimer laser (193 nm), a EUV radiation, an x-ray, an e-beam, an ion beam, and/or other suitable radiations. The operation 106 may be performed in air, in a liquid (immersion lithography), or in a vacuum (e.g., for EUV lithography and e-beam lithography). In some embodiments, the radiation beam is directed to the resist layer 208 to form an image of a circuit pattern defined on a photomask, such as a transmissive photomask or a reflective photomask in a proper exposing mode, such as step and scan. Various resolution enhancement techniques, such as phase-shifting, off-axis illumination (OAI) and/or optical proximity correction (OPC), may be utilized with the photomask and the exposing process. For examples, the OPC features may be incorporated into the circuit pattern. In another example, the photomask is a phase-shift mask, such as an alternative phase-shift mask, an attenuated phase-shift mask, or a chromeless phase-shift mask. In yet another example, the exposing process is implemented in an OAI mode. In some other embodiments, the radiation beam is directly modulated with a predefined pattern, such as an IC layout, without using a mask (such as using a digital pattern generator or direct-write mode). In the present embodiment, the radiation beam is a EUV radiation and the operation 106 is performed in a EUV lithography system, such as the EUV lithography system.

The operation 106 may further include other steps, such as thermal treatment, after the exposing process. In the present embodiment, the operation 106 includes a post-exposure baking (PEB) process to the semiconductor structure 200, especially to the resist layer 208 coated on the middle layer 206. During the PEB process, the ALG in the exposed resist material is cleaved, the exposed portions of the resist layer 208 are changed chemically (such as more hydrophilic or more hydrophobic). In a specific embodiment, the PEB process may be performed in a thermal chamber at temperature ranging between about 120° C. to about 160° C.

After the operation 106, a latent pattern is formed on the resist layer 208. The latent pattern of a resist layer refers to the exposed pattern on the resist layer, which becomes a physical resist pattern by a developing process. The latent pattern of the resist layer 208 includes exposed portions 208a and unexposed portions 208b. In the present case, of the latent pattern, the exposed portions 208a of the resist layer 208 are physically or chemically changed. In some examples, the exposed portions 208a are deprotected, inducing polarity change for dual-tone imaging (by choosing different types of developer: organic solution or aqueous solution). In other examples, the exposed portions 208b are changed in polymerization, such as depolymerized as in positive resist or cross-linked as in negative resist.

Referring to FIGS. 1 and 2C, the method 100 then proceeds to operation 108 by developing the resist layer 208 in a developer, constructed in accordance with some embodiments. By the developing process, a patterned resist layer 208' is formed. In some embodiments, the resist layer 208 experiences a polarity change after the operation 106, and a dual-tone developing process may be implemented. In some examples, the resist layer 208 is changed from a nonpolar state (hydrophobic state) to a polar state (hydrophilic state), then the exposed portions 208a will be removed by an aqueous solvent (positive tone imaging), such as tetramethyl ammonium hydroxide (TMAH), or alternatively the unexposed portions 208b will be removed by an organic solvent (negative tone imaging), such as butyl acetate. In some other examples, the resist layer 208 is changed from a polar state to a nonpolar state, then the exposed portions 208a will be removed by an organic solvent (positive tone imaging) or the unexposed portions 208b will be removed by an aqueous solvent (negative tone imaging).

In the present example illustrated in FIG. 2C, the exposed portions 208a are removed in the developing process. In this example shown in FIG. 2C, the patterned resist layer 208' is represented by two line patterns. However, the following discussion is equally applicable to resist patterns represented by trenches.

Referring to FIGS. 1 and 2D, the method 100 includes an operation 110 by performing a first etching process to the middle layer 206 using the patterned resist layer 208' as an etch mask, thereby transferring the circuit pattern from the patterned resist layer 208' to the middle layer 206. The first etching process is designed with an etchant to selectively etch the middle 206 layer but stops on the bottom layer 204 due to the etching selectivity between the ML and BL. The first etching process may be a dry etch, a wet etch, or a combination thereof. In some example, the first etching process includes a dry etch with fluorine-containing etchant, such as $CF_4$, $SF_6$, $NF_3$, or $CH_2F_2$. After the first etching process, the patterned resist layer 208' may be removed by wet stripping or plasma ashing, as illustrated in FIG. 2E.

Figure 2F:
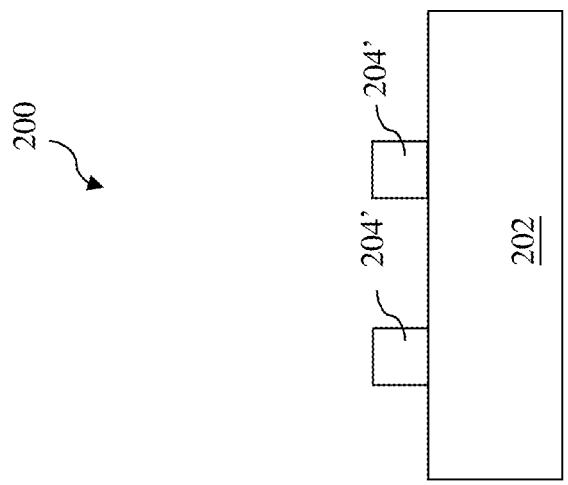
Figure 2E:
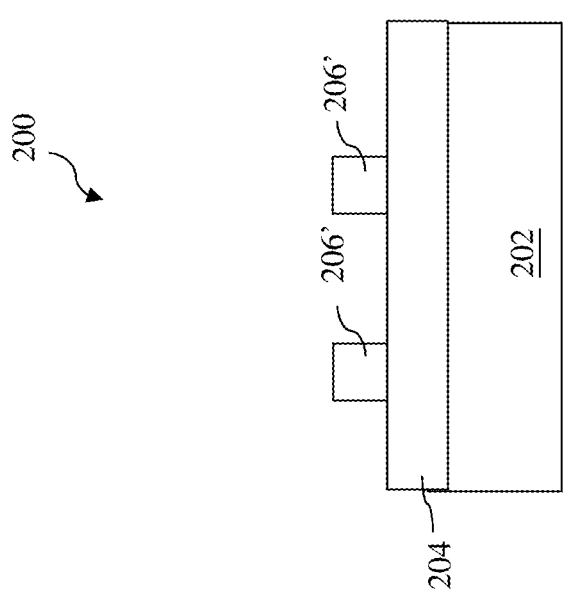

Referring to FIGS. 1 and 2F, the method 100 includes an operation 112 by performing a second etching process to the bottom layer 204 using the patterned middle layer 206' as an etch mask, thereby transferring the circuit pattern from the patterned middle layer 206' to the bottom layer 204. The second etching process is designed with an etchant to selectively etch the bottom 204 layer without significant removal of the middle layer due to the etching selectivity between the ML and BL. The second etching process may be a dry etch, a wet etch, or a combination thereof. In some example, the second etching process includes a dry etch with oxygen-containing etchant, such as $O_2$ or other suitable gas. After the second etching process, the patterned middle layer 206' may be removed by a proper technique, such as wet etching.

Referring to FIG. 1, the method 100 may further other operations. For example, the method includes an operation 114 by performing a fabrication process to the semiconductor structure 200 using the patterned bottom layer 204' as a mask such that the fabrication process is only applied to the portions of the semiconductor structure 200 within the openings of the patterned bottom layer 204' while other portions covered by the patterned bottom layer 204' are protected from being impacted by the fabrication process. In some embodiments, the fabrication process includes an etching process applied to the substrate 202, such as an underlying material layer using the patterned bottom layer 204' as an etch mask, thereby transferring the pattern from the patterned bottom layer 204' to the underlying material layer. In alternative embodiments, the fabrication process includes an ion implantation process applied to the semiconductor structure 200 using the patterned bottom layer 204' as an implantation mask, thereby forming various doped features in the semiconductor structure 200.

In some examples, the underlying material layer is a semiconductor material layer, a conductive material layer or a dielectric material layer. To further this embodiment, the pattern is transferred from the patterned bottom layer 204' to the underlying material layer by etch or ion implantation.

Although not shown in FIG. 1, the method 100 may include other operations before, during or after the operations described above. In an embodiment, the substrate 202 is a semiconductor substrate and the method 100 proceeds to forming fin field effect transistor (FinFET) structures. In this embodiment, the method 100 includes forming a plurality of active fins in the semiconductor substrate 202. In furtherance of the embodiment, the operation 110 further includes etching the substrate 202 through the openings of the patterned bottom layer 204' to form trenches in the substrate 202; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes in the semiconductor substrate 202. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 114 to form a plurality of trenches. The method 100 proceeds to filling the trenches with a conductive material, such as a metal; and further proceeds to polishing the conductive material using a process such as chemical mechanical planarization (CMP) to expose the patterned ILD layer, thereby forming the metal lines in the ILD layer. The above are non-limiting examples of devices/structures that can be made and/or improved using the method and the material layer according to various aspects of the present disclosure. The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

The present disclosure provides a photolithography process and associated material layers with enhanced etching selectivity. Especially, the photoresist layer is a tri-layer. The middle layer is designed with different compositions, solution concentration and processing steps to modify the characteristics of the middle layer, including reduced carbon concentration, increased material density and enhance etch selectivity from the bottom layer. In various embodiments, the etch selectivity between ML and BL is improved from 1 to greater than 1.6. The LCDU is improved from greater than 4.6 to less than 4.2.

Thus, the present disclosure provides a method for lithography patterning in accordance with some embodiments. The method includes coating a bottom layer on a substrate, wherein the bottom layer includes a carbon-rich material; forming a middle layer on the bottom layer, wherein the middle layer has a composition such that its silicon concentration is enhanced to be greater than 42% in weight; coating a photosensitive layer on the middle layer; performing an exposing process to the photosensitive layer; and developing the photosensitive layer to form a patterned photosensitive layer.

The present disclosure also provides a method for lithography patterning in accordance with some other embodiments. The method includes coating a bottom layer on a substrate, wherein the bottom layer includes a carbon-rich material; coating a middle material solution on the bottom layer; performing a curing baking process to the middle material solution with a first baking temperature; thereafter performing an outgassing baking process to the middle material solution with a second baking temperature greater than the first baking temperature to form a middle layer with enhanced silicon concentration; coating a photosensitive layer on the middle layer; performing an exposing process to the photosensitive layer; and developing the photosensitive layer to form a patterned photosensitive layer. The middle material solution includes linear polymer chains and a cross-linking additive mixed in a solvent.

The present disclosure provides a method for lithography patterning in accordance with yet some other embodiments. The method includes coating a bottom layer on a substrate, wherein the bottom layer is made of a carbon-rich material having a phenol group; preparing a middle material solution on the bottom layer; coating the middle material solution to the bottom layer; performing a curing baking process to the middle material solution with a first baking temperature; thereafter performing an outgassing baking process to the middle material solution with a second baking temperature greater than the first baking temperature, thereby forming a middle layer with enhanced silicon concentration; coating a photosensitive layer on the middle layer; and performing an exposing process to the photosensitive layer. The middle material solution includes linear polymer chains, a cross-linker and a cross-linking additive mixed in a solvent. The cross-linker includes a silicon hydroxide, wherein the preparing of the middle material solution includes preheating.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
coating a bottom layer on a substrate, wherein the bottom layer includes a carbon-rich material;
forming a middle layer on the bottom layer, wherein the middle layer has a composition such that its silicon concentration is enhanced to be greater than 42% in weight;
coating a photosensitive layer on the middle layer;
performing an exposing process to the photosensitive layer; and
developing the photosensitive layer to form a patterned photosensitive layer.

2. The method of claim 1, wherein the forming of the middle layer includes:
spin-on coating a middle material solution on the bottom layer; and
after the spin-on coating, performing a baking process to the middle material solution to form the middle layer with enhanced silicon concentration.

3. The method of claim 2, wherein the middle material solution includes linear polymer chains and a cross-linking additive mixed in a solvent.

4. The method of claim 3, wherein the linear polymer chains include silicon hydroxides with a molecular weight ranging between 2000 Dalton and 3000 Dalton.

5. The method of claim 3, wherein the linear polymer chains have a chemical structure formulated as

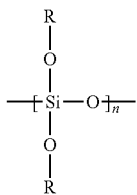

wherein n is an integer and R is a chemical group bonded to each hydroxyl end of silicon hydroxide, wherein the chemical group is chosen from hydrogen (H), hydroxyl group (OH), methyl group ($CH_3$), and ethyl group ($C_2H_5$).

6. The method of claim 5, wherein:
the linear polymer chains have a molecular weight ranging between 2000 Dalton and 3000 Dalton; and
the cross-linking additive includes a chemical structure with a molecular weight less than 130 and pKa less than 7.

7. The method of claim 3, further comprising preparing the middle material solution before the spin-on coating of the middle material solution, wherein the preparing the middle material solution further includes a preheating process to form the linear polymer chains with a desired polymer chain length.

8. The method of claim 7, wherein the preheating process includes a preheating temperature ranging from 40° C. to 120° C. and a preheating duration ranging from 30 minutes to 720 minutes.

9. The method of claim 3, wherein the performing of the baking process to the middle material solution includes:
performing a curing baking process to the middle material solution with a first baking temperature, thereby cross-linking the linear polymer chains; and
thereafter performing an outgassing baking process to the middle material solution with a second baking temperature, thereby outgassing the cross-linking additive, wherein the second baking temperature is greater than the first baking temperature.

10. The method of claim 9, wherein
the first baking temperature ranges from 150° C. to 200° C.; and
the second baking temperature ranges from 200° C. to 300° C.

11. The method of claim 1, wherein the bottom layer is a carbon-rich material having a plurality of phenol bonded together.

12. The method of claim 1, further comprising
performing a first etching process to selectively etch the middle layer through openings of the patterned photosensitive layer using a first etchant containing fluorine, thereby forming a patterned middle layer; and
performing a second etching process to selectively etch the bottom layer through openings of the middle layer using a second etchant containing oxygen, thereby forming a patterned bottom layer.

13. A method for lithography patterning, comprising:
coating a bottom layer on a substrate, wherein the bottom layer includes a carbon-rich material;
coating a middle material solution on the bottom layer, wherein the middle material solution includes linear polymer chains and a cross-linking additive mixed in a solvent;
performing a curing baking process to the middle material solution with a first baking temperature;
thereafter performing an outgassing baking process to the middle material solution with a second baking temperature greater than the first baking temperature, thereby forming a middle layer with enhanced silicon concentration;
coating a photosensitive layer on the middle layer;
performing an exposing process to the photosensitive layer; and
developing the photosensitive layer to form a patterned photosensitive layer.

14. The method of claim 13, wherein
the linear polymer chains includes silicon hydroxide with each hydroxyl end bonded with a chemical group, wherein the chemical group is chosen from hydrogen (H), hydroxyl group (OH), methyl group ($CH_3$), and ethyl group ($C_2H_5$), wherein a molecular weight of the linear polymer chains is greater than 800 Dalton; and
the cross-linking additive includes a chemical structure with a molecular weight less than 130 and pKa less than 7.

15. The method of claim 13, wherein the middle material solution is free of a phenyl group.

16. The method of claim 13, wherein the cross-linking additive is a chemical chosen from Oxalic acid, Formic acid, Acetic acid, Propionic acid, Butyric acid, Valeric acid, Caproic acid, and Succinic acid.

17. The method of claim 13, further comprising preparing the middle material solution before the coating of the middle material solution, wherein the preparing the middle material solution further includes a preheating process to form the linear polymer chains.

18. The method of claim 17, wherein the preheating process includes a preheating temperature ranging from 40° C. to 120° C. and a preheating duration ranging from 30 minutes to 720 minutes.

19. The method of claim 13, wherein
- the first baking temperature ranges from 150° C. to 200° C.; and
- the second baking temperature ranges from 200° C. to 300° C.

20. A method for lithography patterning, comprising:
- coating a bottom layer on a substrate, wherein the bottom layer is made of a carbon-rich material having a phenol group;
- preparing a middle material solution on the bottom layer, wherein the middle material solution includes linear polymer chains, a cross-linker and a cross-linking additive mixed in a solvent, wherein the cross-linker includes a silicon hydroxide, wherein the preparing of the middle material solution includes preheating;
- coating the middle material solution to the bottom layer;
- performing a curing baking process to the middle material solution with a first baking temperature;
- thereafter performing an outgassing baking process to the middle material solution with a second baking temperature greater than the first baking temperature, thereby forming a middle layer with enhanced silicon concentration;
- coating a photosensitive layer on the middle layer; and
- performing an exposing process to the photosensitive layer.

* * * * *